United States Patent [19]

Rivkin

[11] 4,434,899

[45] Mar. 6, 1984

[54] ADJUSTABLE WIRE TOTE FOR PRINTED CIRCUIT BOARDS

[75] Inventor: Eric M. Rivkin, Minnetonka, Minn.

[73] Assignee: Liberty Carton Co., Minneapolis, Minn.

[21] Appl. No.: 207,223

[22] Filed: Nov. 17, 1980

[51] Int. Cl.³ .............................................. B05C 13/02
[52] U.S. Cl. ..................................... 211/41; 211/181; 361/415
[58] Field of Search .......................... 211/41, 181, 184; 206/334, 454, 456; 361/415

[56] References Cited

U.S. PATENT DOCUMENTS

| | | | |
|---|---|---|---|
| 1,901,365 | 3/1933 | Field | 211/184 |
| 2,239,483 | 4/1941 | Cocks | 211/181 X |
| 3,197,731 | 7/1965 | Beale et al. | 361/415 X |
| 3,265,935 | 8/1966 | Rosa | 361/415 |
| 3,407,938 | 10/1968 | Walter et al. | 361/415 |
| 3,772,572 | 11/1973 | Marquette | 211/41 X |
| 3,941,273 | 3/1976 | Dalencon | 211/41 X |
| 4,231,175 | 11/1980 | Baxter | 211/181 X |
| 4,245,746 | 1/1981 | Aylor | 211/184 X |
| 4,256,229 | 3/1981 | Lee | 211/41 |
| 4,261,464 | 4/1981 | Maitland | 21/41 X |

Primary Examiner—James T. McCall
Assistant Examiner—Peter A. Aschenbrenner
Attorney, Agent, or Firm—Williamson, Bains, Moore & Hansen

[57] ABSTRACT

A tote carrier for printed circuit boards is formed of wire members with each side being formed of a plurality of parallel wire members. The two ends have slidably mounted thereon at least two card holding members which are parallel to each other, which members have slots therein for holding the boards in position. The tote is stackable in two directions for either storage or assembly.

9 Claims, 7 Drawing Figures

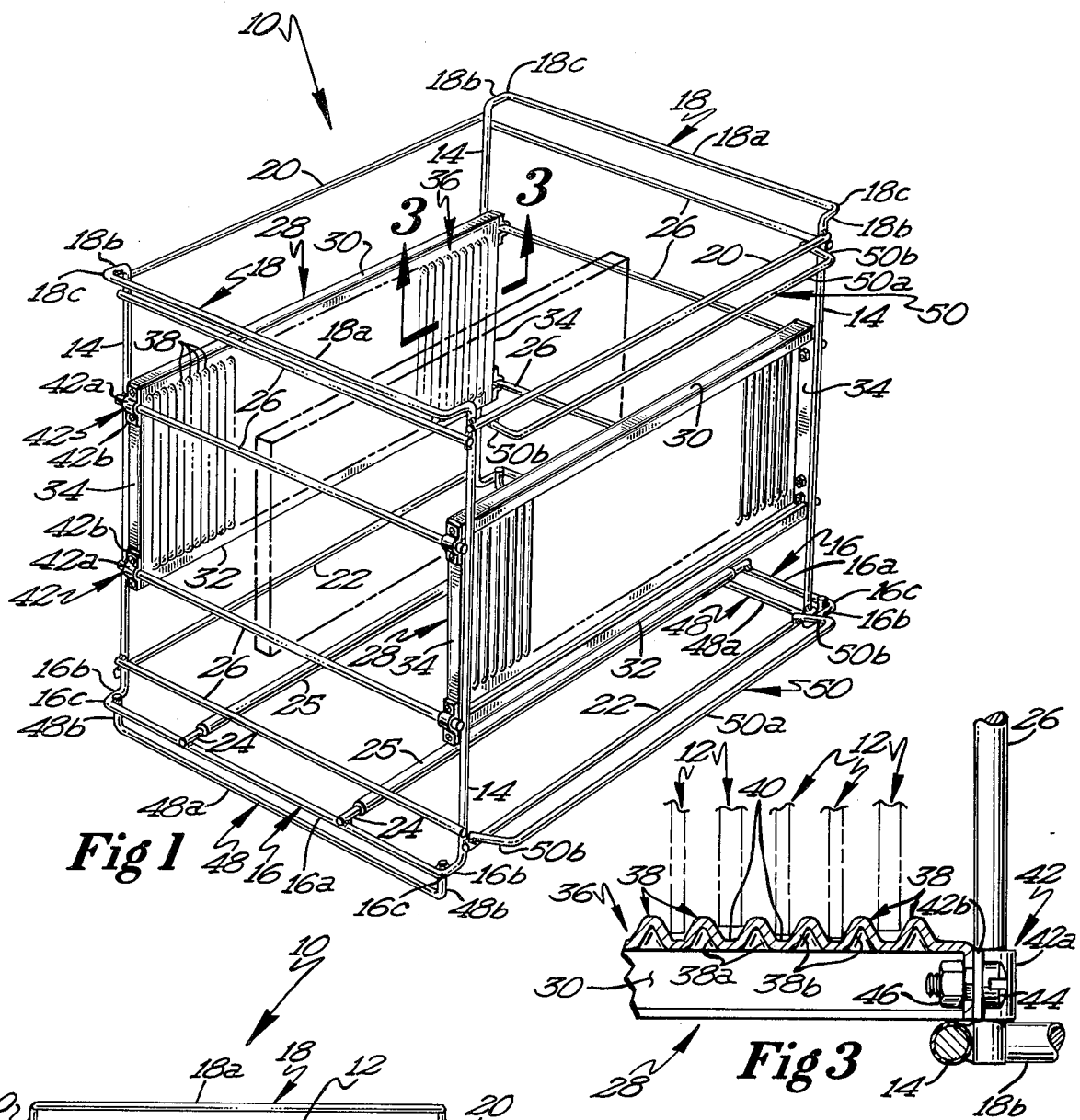

U.S. Patent  Mar. 6, 1984  Sheet 2 of 2  4,434,899
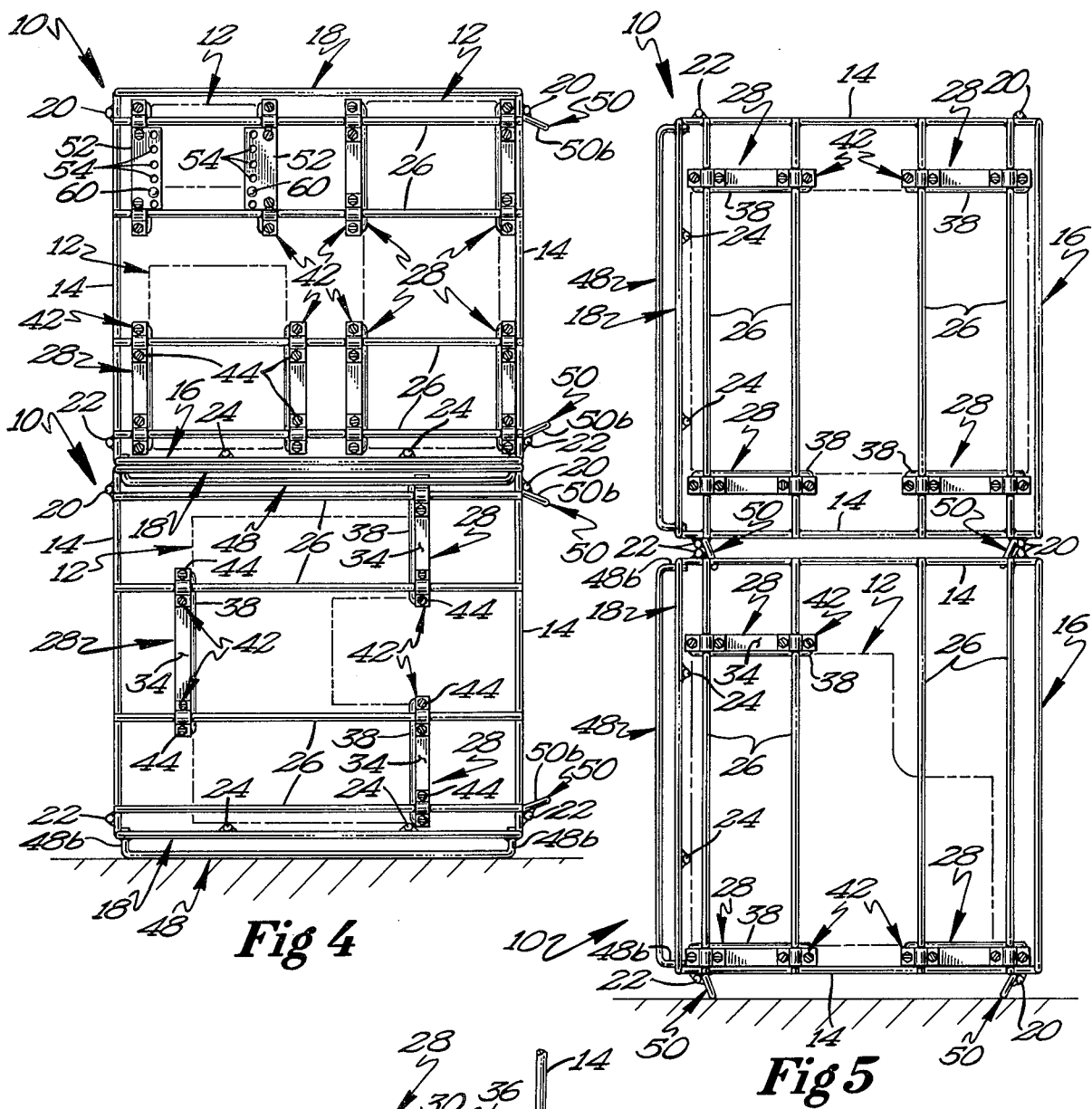
Fig 4
Fig 5
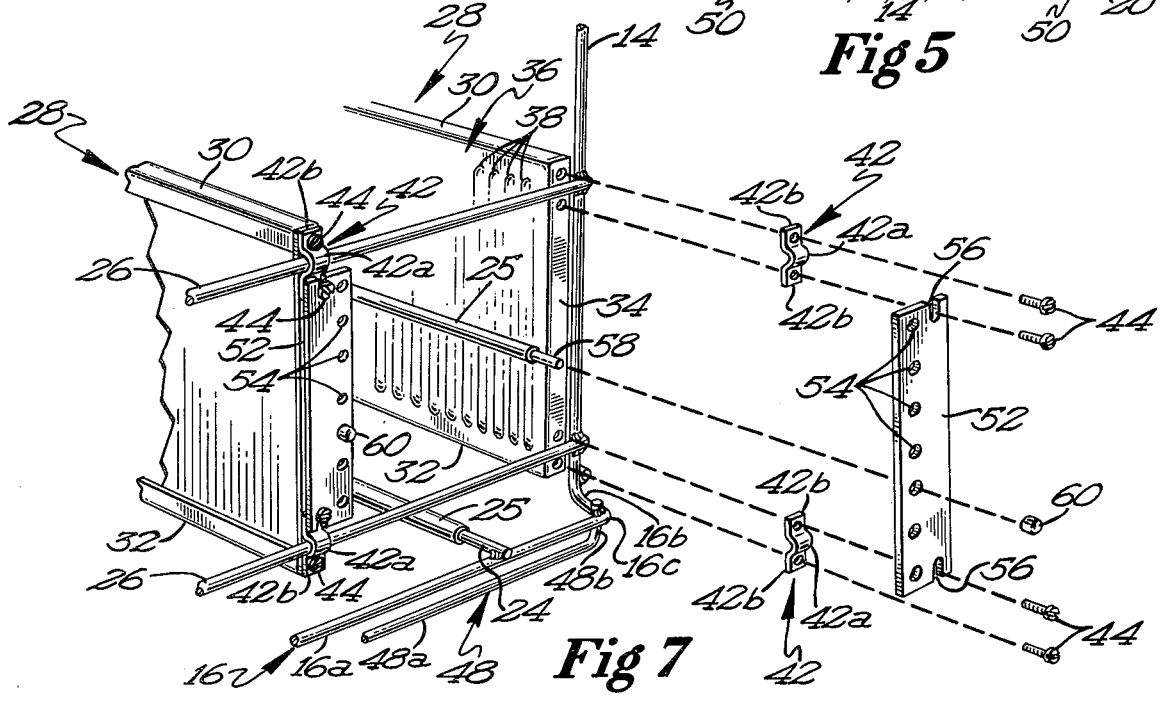
Fig 7

ADJUSTABLE WIRE TOTE FOR PRINTED CIRCUIT BOARDS

BACKGROUND OF THE INVENTION

Many efforts have been made at providing carrying or storage devices for various types of printed circuit boards. These include simple corrugated boxes with foam liners suited to carrying single boards. Provision has also been made for a device having two plates each of which has a number of rectangular slots thereon and which plates are in parallel spaced relationship as shown in U.S. Pat. No. 3,014,594. Devices such as this are generally only suited for limited uses such as holding a number of boards during the assembly process and are not really suited to long-term storage and/or transport.

It is, therefore, an object of this invention to provide a circuit board tote which is adaptable to a large number of different sized and shaped boards and which is suited for storage and transport in that the device is strong enough to put up with a certain amount of abuse. It is also important that the device be capable of protecting the boards from static shock, and toward this end proper material selection is important.

SUMMARY OF THE INVENTION

The main frame of the tote is formed of steel wire members and is comprised of four corner posts connected by a plurality of parallel spaced wire members. The members on the two ends of the device are equally spaced for reasons which will be explained in detail hereinafter. At least two board holding members are provided. These board holding members are stamped of stainless steel and have a plurality of parallel slots stamped therein for engaging the edge of the circuit boards. The slots are non-parallel in cross-section such that each slot is capable of snugly and wedgingly engaging a variety of board thicknesses. The card holding members are adjustably clamped to at least two of the wire end members at each end thereof and extend from one end to the other of the tote. As noted previously, at least two of these card holding members are provided to locate the boards therebetween. The wire members are coated with an epoxy coating which allows the tote to be oven proof as well as capable of preventing any static charge buildup. Neoprene sleeves are placed on the bottom wire members to cushion the bottom edges of the boards which may abut thereagainst. Stacking members are provided both at the bottom of the two end members provided above and on the top and bottom of one of the sides, thereby allowing the tote to be stacked in two directions; either with the bottom of one tote fitting into the top of another or with the totes stacked one side upon another with the top opening facing sideways for removal and insertion of the boards during the assembly process. A system is further provided wherein the boards may be supported at an adjustable height between the card holding members so that the top of the board need not be engaged between the slots if the top of the board has connectors or the like thereon.

These and other objects and advantages of the invention will become readily apparent as the following description is read in conjunction with the accompanying drawings wherein like reference numerals are used to refer to the views.

BRIEF DESCRIPTION OF THE DRAWINGS

FIG. 1 is a perspective view of the instant invention.
FIG. 2 is an end plan view of the invention.
FIG. 3 is a section taken along line 3—3 of FIG. 1.
FIG. 4 is a plan view showing two totes stacked in the bottom-to-top stacking mode with several different card holding arrangements shown therein.
FIG. 5 shows the side-to-side stacking configuration with several more alternative board holding arrangements.
FIG. 6 shows in detail the stacking interaction of FIG. 4.
FIG. 7 is a perspective exploded view showing the adjustable bottom stop feature.

DESCRIPTION OF THE PREFERRED EMBODIMENT

Looking at the device shown generally in FIGS. 1-4, the tote, generally 10, is designed for carrying one or more circuit boards 12, shown in phantom in FIGS. 2 and 3. The tote is comprised of four vertical corner members 14. Attached at the bottom of corner rails 14 are horizontally disposed U-shaped end rails 16. End rails 16 are generally formed integrally with corner posts 14, as can be seen in FIG. 1. The rails as described above and hereinafter are identically formed of a steel wire which after assembly of the wire portions of the invention are dipped in an epoxy coating which is desirably conductive to electricity in order to prevent the buildup of static charges. Similarly, two U-shaped top end rails 18 are attached at the top of corner posts 14. As can be seen in FIGS. 1 and 6, bottom and top rails 16 and 18 respectively project horizontally outwardly from corner posts 14 in order to provide both an easily grabbed handle and a stacking capability, as will be more fully described hereinafter. Top side rails 20 and bottom side rails 22 join corner posts 14 to form a rectangular receptacle. One or more bottom members 24 are attached to end bottom members 16. Bottom members 24 extend from end to end and are covered with a sleeve 25 made of neoprene which acts to cushion the edges of boards 12 and which is also capable of withstanding the elevated temperatures utilized in the baking process which boards may be subjected to during assembly. At least two central end members 26 are provided at each end. End members 26 connect corner posts 14 and are parallel to one another and desirably equally spaced from one another for reasons which will be explained more fully hereinafter. In the preferred embodiment of the invention, four end members 26 are provided at each end.

As can be seen in FIGS. 1 through 3, rectangular card holding members 28 are slidably clamped to end members 26. Card holding members 28 are rectangular in shape and stamped of stainless steel. A top ridge 30, bottom ridge 32 and end ridges 34 are formed about the periphery of the member 28 for reinforcement and mounting. Stamped on the central surface of card holding member 28 is a ribbed surface 36 which consists of spaced parallel peaks 38 separated by troughs 40 which are flat in nature. As can be seen in FIG. 3., the device is designed to accommodate a number of different thicknesses of circuit board. The narrowest of boards, about one-sixteenth of an inch, are designed to rest snugly in the bottom troughs 40 of the board. The thicker boards 12 may be wedgingly engaged higher up between opposing surfaces 38a and 38b in order to snugly engage the boards and prevent rattling and damage.

Card holding members 28 and in particular end ribs 34 are clampingly mounted to end members 26 by means of clamping members 42. Clamping members 42 are comprised of a U-shaped center portion 42a which engages one of end members 26 and depending flange portions 42b having a hole therein through which passes a screw 44 which is in turn threadingly engaged in a nutsert engaged in the end ridge 34. Thus, card holding member 28 may be adjustably positioned by means of loosening and tightening screws 44 such that card holding member 28 is slid along end member 26. FIG. 1 shows an alternate position in phantom from the two more detailed members 28 shown in solid lines.

FIGS. 4 and 5 show a variety of options available for storage of the printed circuit boards. As noted previously, end members 26 are equally spaced and toward that end variation of placement of card holding members 28 may be seen. Thus, for narrow boards, more than one set of boards may be placed along the length of the tote as shown in the upper tote in FIG. 4. Also, if a very deep board is utilized, such as that shown in the top tote in FIG. 5, upper and lower card holding members 28 may be utilized to more securely hold the board. It can be appreciated that a wide variety of board holding arrangements is available given a standard tote and standard card holding member 28.

There are times when a particular circuit board may have connectors or the like at one end thereof and due to the presence of these components it is not practical for the end of the board to be engaged between opposing card holding members 28. Such a situation is shown in the upper left hand corner of FIG. 4 and an apparatus for solving such a problem is shown in FIG. 7 as well. In particular, a retaining plate 52 is formed of a rectangular piece of material and has two slots 56 at either end thereof for engagement with screws 44 on the end of each card holding member 28. A plurality of apertures 54 are provided and spaced along one side of retaining plate 52 in order to provide multiple positions for retaining bottom retention rod 58. Bottom retention rod 58 engages the lower edge of a board 12 and the height of rod 58 may be adjusted by placement of rod 58 in the various apertures 54. Rod 58 is retained in retaining plate 52 by means of neoprene end caps 60 which merely slip over and snugly engage the ends of rod 58. A neoprene sleeve 25 is placed over rod 58 for the same reasons noted above.

As noted previously, provision is made for stacking in two dimensions and such stacking is particularly illustrated in FIGS. 4 through 6. In the conventional top to bottom stacking shown in FIGS. 4 and 6, U-shaped bottom and top end rails, 16 and 18 respectively, are comprised of a center 16a and 18a and depending legs 16b and 18b which join base sections 16a and 18a at corners 16c and 18c. Provided at the corners 16c of bottom end rail 16 are stacking skids 48 which serve both as a base or skid member to elevate the bottom of the tote from the surface on which the tote may be placed and also for stacking. Stacking member 48 is comprised of a base section 48a and depending legs 48b. As shown in FIGS. 4 and 6, legs 48b engage the inside of corners 18c of the tote below to form a stable nesting stack for use during storage and/or transport.

Stacking in a side-to-side manner is shown in FIG. 5 and such storage is commonly designed to be used during the assembly process when all of the boards are desired to be accessible from the side for performing of one or more operations thereon. In particular, side stacking members 50 are affixed to side members 22 and are comprised of a base portion 50a with depending leg portions 50b. As can be seen in FIG. 5, stacking members 50 nest essentially at the junction formed by side members 20 and 22 and corner posts 14.

If desired, for long-term storage, tote 10 may be encased in either a plastic bag or a simple corrugated carton in order to protect the tote and boards from dust or the like. Such protection need have no structural value per se as structural strength is more than amply provided by the tote itself.

While the preferred embodiments of the present invention have been described, it should be understood that various changes, adaptations and modifications may be made therein without departing from the spirit of the invention and the scope of the appended claims.

What is claimed is:

1. A wire frame tote for printed circuit boards, said tote comprising:
    a frame comprising:
        first and second sides;
        first and second ends; and
    at least first and second board holding means, each
        said board holding means being continuously adjustably attached to said first and second sides, each said board holding means having a plurality of spaced parallel grooves for receiving the edge of a printed circuit board, each said groove comprising first and second opposing walls, said first and second walls being non-parallel, each said groove further comprising a bottom wall, said bottom wall connecting said first and second walls, said first and second walls diverging away from each other and away from said bottom wall, said board holding means being adjustable so as to vary the distance between said grooves on said first board holding means and said grooves on said second board holding means and accommodate opposite sides of a board.

2. The wire frame tote for printed circuit boards of claim 1 wherein each of said sides comprises a plurality of parallel wire members.

3. The wire frame tote for printed circuit boards of claim 1 wherein each of said sides comprises at least four parallel equally spaced wire members.

4. The wire frame tote for printed circuit boards of claim 2 wherein said each board holding means has first and second ends and is selectively fixable to at least two of said wire members at each end of said holding means.

5. The wire frame tote for printed circuit boards of claim 4 further comprising means for restraining the bottom of said boards.

6. The wire frame tote for printed circuit boards of claim 1, said restraining means further comprising a horizontal retention rod extending between said board holding means and means for adjustably vertically positioning said rod relative to said board holding means.

7. The wire frame tote for printed circuit boards of claim 6 wherein said positioning means comprises at least two plates, each said plate having a plurality of vertically spaced apertures therein for receiving said rod, each said plate being attached to one end of one of said board holding means.

8. The wire frame tote for printed circuit boards of claim 1 further comprising means for nestably stacking said totes in top-to-bottom relationship.

9. The wire frame tote for printed circuit boards of claim 8 further comprising means for nestably stacking said totes in side-to-side relationship.

* * * * *